(12) United States Patent
Lee et al.

(10) Patent No.: US 9,152,326 B2
(45) Date of Patent: Oct. 6, 2015

(54) SEMICONDUCTOR MEMORY DEVICE

(71) Applicant: SK hynix Inc., Icheon-si Gyeonggi-do (KR)

(72) Inventors: Wan Seob Lee, Chuncheon-si Gangwon-do (KR); Jin Su Park, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/845,433

(22) Filed: Mar. 18, 2013

(65) Prior Publication Data

US 2014/0108725 A1    Apr. 17, 2014

(30) Foreign Application Priority Data

Oct. 12, 2012    (KR) .......................... 10-2012-0113482

(51) Int. Cl.
*G11C 29/26* (2006.01)
*G06F 3/06* (2006.01)
*G11C 29/00* (2006.01)

(52) U.S. Cl.
CPC ............ *G06F 3/0619* (2013.01); *G11C 29/785* (2013.01); *G11C 29/846* (2013.01); *G11C 2229/723* (2013.01)

(58) Field of Classification Search
CPC ........ G11C 29/70; G11C 29/24; G11C 29/04; G11C 29/785; G11C 29/846; G11C 2229/723; G06F 3/0619

USPC ............................................ 365/200, 189.17

See application file for complete search history.

(56) References Cited

U.S. PATENT DOCUMENTS

| | | | | |
|---|---|---|---|---|
| 7,466,611 | B1* | 12/2008 | Chen | 365/200 |
| 8,477,547 | B2* | 7/2013 | Park | 365/200 |
| 2008/0068905 | A1* | 3/2008 | Kim | 365/200 |
| 2008/0316844 | A1* | 12/2008 | Chen | 365/200 |
| 2011/0205796 | A1* | 8/2011 | Kim | 365/185.09 |
| 2011/0267899 | A1* | 11/2011 | Kim et al. | 365/189.05 |
| 2012/0057415 | A1* | 3/2012 | Cho | 365/189.07 |
| 2012/0106270 | A1* | 5/2012 | Park | 365/189.17 |
| 2012/0195144 | A1* | 8/2012 | Ide et al. | 365/200 |
| 2013/0117636 | A1* | 5/2013 | Kim et al. | 714/773 |

FOREIGN PATENT DOCUMENTS

| | | |
|---|---|---|
| KR | 1020030017885 A | 3/2003 |
| KR | 1020120043999 A | 5/2012 |

* cited by examiner

*Primary Examiner* — Son Dinh
*Assistant Examiner* — Jerome LeBoeuf
(74) *Attorney, Agent, or Firm* — William Park & Associates Ltd.

(57) ABSTRACT

A semiconductor memory device includes a memory cell array configured to include sub memory blocks and a redundancy memory block, data line groups configured to deliver data to be programmed into the sub memory blocks and data read from the sub memory blocks, a redundancy data line group configured to deliver data to be programmed into the redundancy memory block and data read from the redundancy memory block, and switching circuits configured to couple selectively the data line groups to the redundancy data line group.

12 Claims, 11 Drawing Sheets

FIG. 10

| | FS1 | RS1 | FS2 | RS2 | SW1 | SW2 | SW3 |
|---|---|---|---|---|---|---|---|
| case1 | 0 | - | 0 | - | off | off | off |
| case2 | 1 | 1 | 1 | 0 | on | off | on |
| case3 | 1 | 1 | 0 | - | on | off | off |
| case4 | | 0 | | | on | on | off |
| case5 | 0 | - | 1 | 1 | off | on | on |
| case6 | | | | 0 | off | off | on |

SEMICONDUCTOR MEMORY DEVICE

CROSS-REFERENCE TO RELATED APPLICATION

This application claims priority under 35 U.S.C. §119(a) to Korean Patent Application No. 10-2012-0113482, filed on Oct. 12, 2012 in the Korean Intellectual Property Office, the contents of which are incorporated herein by reference in its entirety.

BACKGROUND

The present invention relates to a semiconductor memory device.

A semiconductor memory refers to a memory device formed of semiconductor material such as silicon Si, germanium Ge, gallium arsenide GaAs, indium phospide Inp, etc. Semiconductor memory devices are divided into volatile and non-volatile type memory devices.

The volatile memory device requires a power supply to retain the stored data. The volatile memory device includes a static RAM SRAM, a dynamic RAM DRAM, a synchronous DRAM SDRAM and so on. However, the non-volatile memory device retains data stored in the device even in the absence of a power supply. The non-volatile memory device includes a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. Flash memory devices are divided into NOR and NAND type memory devices.

Portions of a memory cell array in the semiconductor memory device may become faulty due to various causes. The memory cell array includes a redundancy memory area for replacing bad areas. For example, bad areas in the memory cell array may be detected in a test process after a manufacturing process of the semiconductor memory device. However, the redundancy memory area increases the area of the semiconductor memory device. Thus, there is a need for a semiconductor memory device with reduced area that still provides the redundancy memory area.

SUMMARY OF THE INVENTION

Various embodiments of the present invention provide a semiconductor memory device having reduced area.

A semiconductor memory device according to an embodiment of the present invention includes a memory cell array including sub memory blocks and a redundancy memory block; data line groups configured to deliver data to be programmed into the sub memory blocks and data read from the sub memory blocks; a redundancy data line group configured to deliver data to be programmed into the redundancy memory block and data read from the redundancy memory block; and switching circuits configured to selectively couple the data line groups to the redundancy data line group.

In another embodiment of the present invention, the semiconductor memory device further includes page buffers coupled between the sub memory blocks and the data line groups; and a redundancy page buffer coupled between the redundancy memory block and the redundancy data line group.

Data to be programmed to the redundancy memory block may be delivered through one of the data line groups to the redundancy data line group, and the redundancy page buffer may program the data delivered through the redundancy data line group to the redundancy memory block.

The redundancy page buffer may read from the redundancy memory block, and the data read from the redundancy memory block may be delivered through the redundancy data line group to one of the data line groups.

A semiconductor memory device according to another embodiment of the present invention includes a first sub memory block and a second sub memory block; a first redundancy memory block and a second redundancy memory block; a first data line group and a second data line group corresponding to the first sub memory block and the second sub memory block, respectively; a first redundancy data line group and a second redundancy data line group corresponding to the first redundancy memory block and the second redundancy memory block, respectively; a first switching circuit configured to couple selectively the first data line group and the first redundancy data line group; a second switching circuit configured to couple selectively the first redundancy data line group and the second redundancy data line group; and a third switching circuit configured to couple selectively the second redundancy data line group and the second data line group.

In another embodiment of the present invention, the semiconductor memory device may further include a redundancy selector including a first redundancy select unit and a second redundancy select unit. Here, the first redundancy select unit configured to select a redundancy memory block between the first and the second redundancy memory blocks for replacing a bad area in the first sub memory block, and the second redundancy select unit configured to select a redundancy memory block between the first and the second redundancy memory blocks for replacing a bad area in the second sub memory block.

A semiconductor memory device according to another embodiment of the present invention includes a memory cell array including sub memory blocks and a redundancy memory block; data line groups corresponding to the sub memory blocks; a redundancy data line group corresponding to the redundancy memory block; and switching circuits configured to selectively couple the data line groups and the redundancy data line group. Here, data to be programmed to the redundancy memory block is delivered to the redundancy data line group through one of the data line groups, and data read from the redundancy memory block is delivered to one of the data line groups through the redundancy data line group.

In various embodiments of the present invention, a semiconductor memory device having reduced area is provided.

BRIEF DESCRIPTION OF THE DRAWINGS

The above and other features and advantages of the present invention will become readily apparent by reference to the following detailed description when considered in conjunction with the accompanying drawings wherein:

FIG. 10 is a view illustrating a table for describing a method of controlling the switching circuits SW1, SW2 and SW3 according to the fail signals FS1 and FS2 and the redundancy signals RS1 and RS2;

DETAILED DESCRIPTION

Hereinafter, various embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
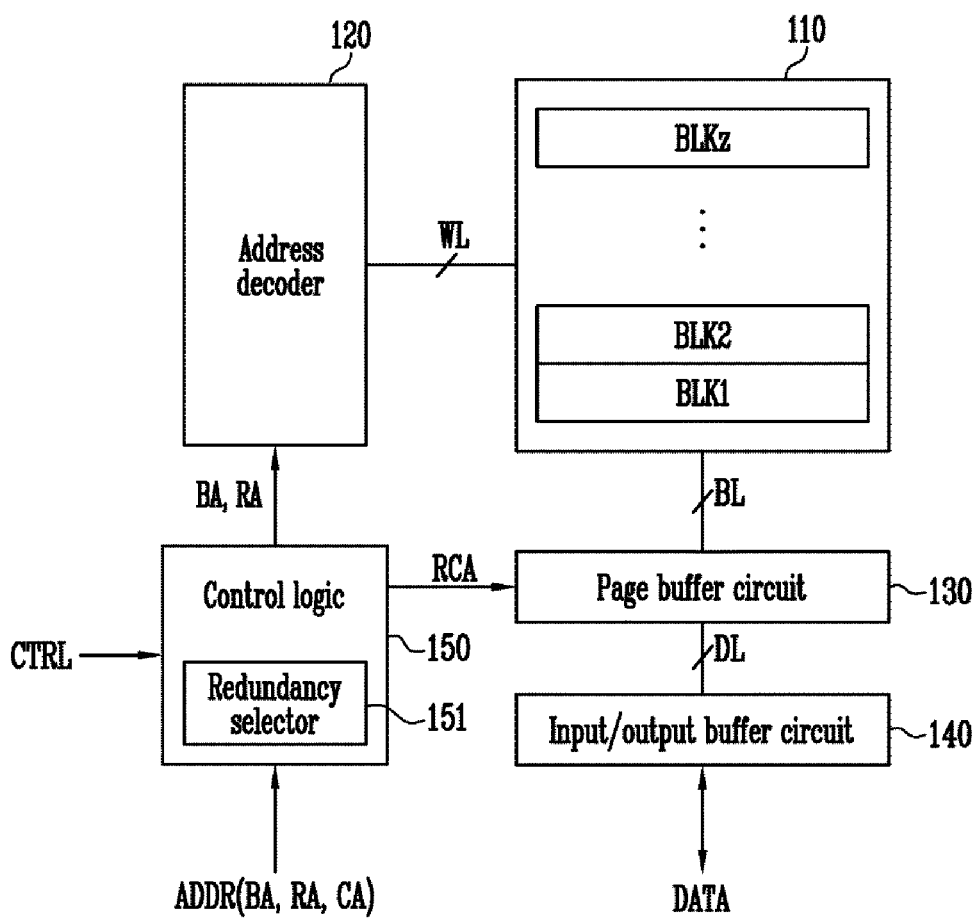
FIG. 1 is a block diagram illustrating a semiconductor memory device according to an embodiment of the present invention.

In FIG. 1, a semiconductor memory device 100 of an embodiment of the present invention may include a memory cell array 110, an address decoder 120, a page buffer circuit 130, an input/output buffer circuit 140 and a control logic 150.

The memory cell array 110 includes memory blocks BLK1, . . . , BLKz. The memory blocks BLK1, . . . , BLKz may be coupled to the address decoder 120 through word lines WL, and may be coupled to the page buffer circuit 130 through bit lines BL. Each of the memory blocks BLK1, . . . , BLKz includes memory cells. A row of memory cells may be commonly coupled to one of the word lines WL.

A column of memory cells may be commonly coupled to one of the bit lines BL. An erase operation of the semiconductor memory device 100 may be performed on a memory block basis. A program operation and a read operation of the semiconductor memory device 100 may be performed on a page basis.

Each of the memory cells may be a single level cell SLC or a multi level cell MLC. For example, memory cells coupled to one word line form one page in the event that the memory cell is a single level cell. Memory cells coupled to one word line form two or more pages in the event that the memory cell is a multi level cell.

Figure 2:
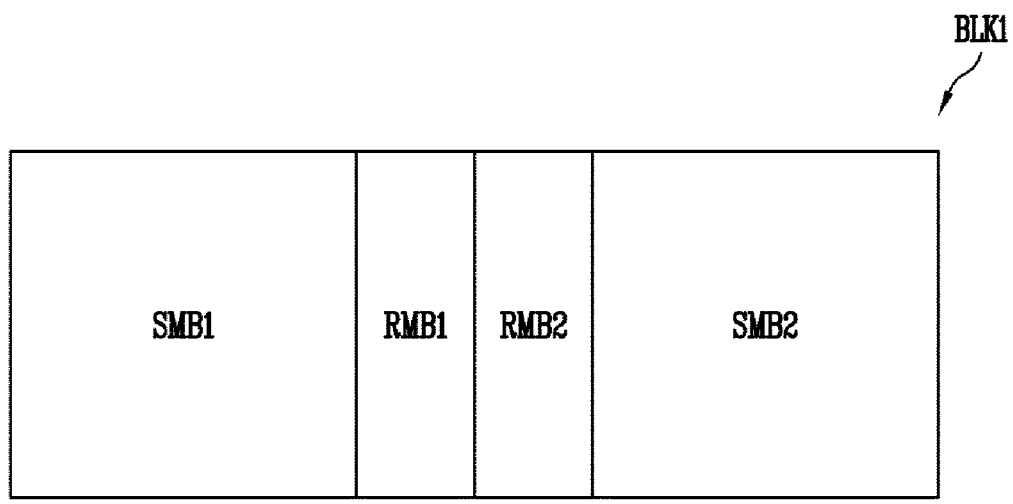
FIG. 2 is a block diagram illustrating one of memory blocks BLK1, ..., BLKz in FIG. 1.

In FIG. 2, one memory block such as BLK1 may include a first sub memory block SMB1, a second sub memory block SMB2, a first redundancy memory block RMB1 and a second redundancy memory block RMB2.

In an embodiment of the present invention, the first redundancy memory block RMB1 may replace a bad area in the second sub memory block SMB2 as well as a bad area in the first sub memory block SMB1. Also, the second redundancy memory block RMB2 may replace the bad area in the first sub memory block SMB1 as well as the bad area in the second sub memory block SMB2. The bad area may include failed signal lines and failed memory cells, but not limited thereto.

Referring to FIG. 1, the address decoder 120 may be coupled to the memory cell array 110 through the word lines WL. The address decoder 120 may operate in response to various signals of the control logic 150. The address decoder 120 may receive a block address BA and a row address RA, for example, from the control logic 150.

The address decoder 120 may decode the block address BA and may select one of the memory blocks BLK1, . . . , BLKz according to the decoded block address.

The address decoder 120 may decode the row address RA and may select a word line coupled to a selected memory block according to the decoded row address.

The address decoder 120 may include a block decoder, a row decoder, an address buffer, etc.

The page buffer circuit 130 may be coupled to the memory cell array 110 through the bit lines BL, and may be coupled to the input/output buffer circuit 140 through data lines DL. The page buffer circuit 130 may operate in response to various signals of the control logic 150, such as receiving and subsequently decoding a redundancy column address RCA from the control logic 150.

In a program operation, the page buffer circuit 130 may receive data DATA to be programmed from the input/output buffer circuit 140, and may deliver the data DATA to bit lines corresponding to the decoded column address of the bit lines BL. The delivered data may be programmed into memory cells coupled to a selected word line.

In a read operation, the page buffer circuit 130 may read data through bit lines corresponding to the decoded column address of the bit lines BL, and may output the read data to the input/output buffer circuit 140.

In an erase operation, the page buffer circuit 130 may float the bit lines BL.

In an embodiment of the present invention, the page buffer circuit 130 may include page buffers (PB1, RPB1, RPB2 and PB2 in FIG. 3) and a column select circuit.

The input/output buffer circuit 140 may be coupled to the page buffer circuit 130 through the data lines DL, and may operate in response to control of the control logic 150.

The input/output buffer circuit 140 may communicate the data DATA with an external device. In the program operation, the input/output buffer circuit 140 may receive the data DATA to be programmed from the external device, and may deliver the data DATA to the page buffer circuit 130. In the read operation, the input/output buffer circuit 140 may receive the read data DATA from the page buffer circuit 130, and may output the read data DATA to the external device.

The control logic 150 may receive a control signal CTRL and an address ADDR. The control logic 150 may control operation of the semiconductor memory device 100 in response to the control signal CTRL.

The control logic 150 may determine whether a column address CA of the address ADDR is substantially identical to a fail column address at which a failure has occurred, and may provide the redundancy column address RCA for replacing the column address CA to the page buffer circuit 130. For example, the fail column address may be a column address of a bad area in the memory cell array 110. If the column address CA is not substantially identical to the fail column address, the control logic 150 may transmit the column address CA to the page buffer circuit 130. If the column address CA is substantially identical to the fail column address, the control logic 150 may transmit the redundancy column address RCA to the page buffer circuit 130 as shown in FIG. 1.

The control logic 150 may determine whether a block address BA of the address ADDR is substantially identical to a fail block address and whether a row address RA of the address ADDR is substantially identical to a fail row address. For example, the fail block address and the fail row address may indicate a block address and a row address of the bad area in the memory cell array 110. Hereinafter, it is assumed that the block address BA and the row address RA are provided to the address decoder 120, for convenience of description.

In an embodiment of the present invention, the control logic 150 may include a redundancy selector 151. The redundancy selector 151 may receive the column address CA of the address ADDR, and may control switching circuits (SW1, SW2 and SW3 in FIG. 3) between the data lines DL according to the received column address CA. This will be described in detail with reference to accompanying drawings FIG. 8 to FIG. 11.

In an embodiment of the present invention, the semiconductor memory device 100 may be a flash memory device.

Figure 3:
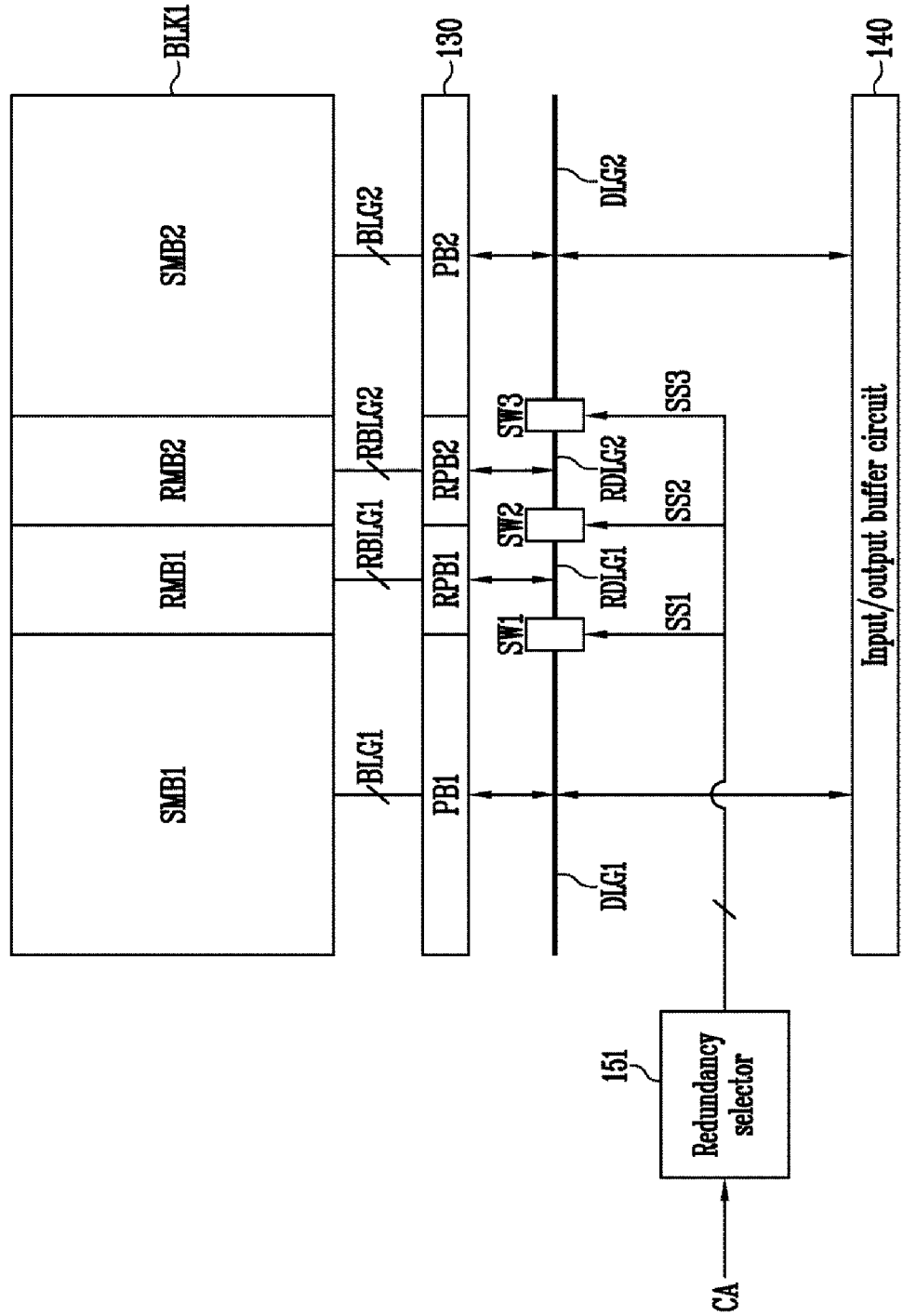
FIG. 3 is a view illustrating a method of controlling the data lines DL in FIG. 1 according to an embodiment of the present invention.

In FIG. 3, one memory block such as BLK1 may be coupled to the page buffer circuit 130, for convenience.

Referring to FIG. 1 and FIG. 3, the page buffer circuit 130 may include a first page buffer PB1, a second page buffer PB2, a first redundancy page buffer RPB1 and a second redundancy page buffer RPB2.

The first page buffer PB1 may be coupled to the first sub memory block SMB1 through a first bit line group BLG1, and the second page buffer PB2 may be coupled to the second sub memory block SMB2 through a second bit line group BLG2. The first redundancy page buffer RPB1 may be coupled to the first redundancy memory block RMB1 through a first redundancy bit line group RBLG1, and the second redundancy page buffer RPB2 may be coupled to the second redundancy memory block RMB2 through a second redundancy bit line group RBLG2. The first and the second bit line groups BLG1 and BLG2 and the first and the second redundancy bit line groups RBLG1 and RBLG2 in FIG. 3 may correspond to the bit lines BL in FIG. 1.

Each of the page buffers temporarily stores data to be programmed into a corresponding memory block and data read from a corresponding memory block. The first page buffer PB1 may store data to be programmed into the first sub memory block SMB1 and data read from the first sub memory block SMB1. The second page buffer PB2 may store data to be programmed into the second sub memory block SMB2 and data read from the second sub memory block SMB2. The first redundancy page buffer RPB1 may store data to be programmed into the first redundancy memory block RMB1 and data read from the first redundancy memory block RMB1. The second redundancy page buffer RPB2 may store data to be programmed into the second redundancy memory block RMB2 and data read from the second redundancy memory block RMB2.

A first data line group DLG1, a second data line group DLG2, a first redundancy data line group RDLG1 and a second redundancy data line group RDLG2 in FIG. 3 may be included in the data lines DL in FIG. 1. The first page buffer PB1, the second page buffer PB2, the first redundancy page buffer RPB1 and the second redundancy page buffer RPB2 may be coupled to the first data line group DLG1, the second data line group DLG2, the first redundancy data line group RDLG1 and the second redundancy data line group RDLG2, respectively. Each of the page buffers exchanges data with the corresponding data line.

The first and the second data line groups DLG1 and DLG2 may be coupled to the input/output buffer circuit 140 through, for example, global data lines. The first and the second redundancy data line groups RDLG1 and RDLG2 may be coupled to the input/output buffer circuit 140 through the first and the second data line groups DLG1 and DLG2.

In an embodiment of the present invention, the switching circuits SW1, SW2 and SW3 are provided to couple to each other the first data line group DLG1, the second data line group DLG2, the first redundancy data line group RDLG1 and the second redundancy data line group RDLG2.

A first switching circuit SW1 may be coupled between the first data line group DLG1 and the first redundancy data line group RDLG1. A second switching circuit SW2 may be coupled between the first redundancy data line group RDLG1 and the second redundancy data line group RDLG2. A third switching circuit SW3 may be coupled between the second redundancy data line group RDLG2 and the second data line group DLG2.

In an embodiment of the present invention, the first redundancy memory block RMB1 may be used for replacing the bad area in the second sub memory block SMB2 as well as the bad area in the first sub memory block SMB1.

In an embodiment of the present invention, a specified area of the first redundancy memory block RMB1 may replace the bad area in the second sub memory block SMB2. For example, data to be programmed to the second sub memory block SMB2 may be transmitted from the input/output buffer circuit 140 through the second data line group DLG2. If the second and the third switching circuits SW2 and SW3 are activated and the first switching circuit SW1 is not activated, data corresponding to the bad area in the second sub memory block SMB2 may be provided to the first redundancy page buffer RPB1 through the second data line group DLG2, the second redundancy data line group RDLG2 and the first redundancy data line group RDLG1. A logic block such as a multiplexer (not shown) may be employed to select a data route. For example, the logic block may select a data route which is formed though the first redundancy page buffer RPB1 and the first redundancy data line group RDLG1 instead of a data route which is formed though the second redundancy page buffer RPB2 and the second redundancy data line group RDLG2 so that data are stored not in the second redundancy page buffer RPB2 but in the first redundancy page buffer RPB1. The other data may be transmitted to the second page buffer PB2 through the second data line group DLG2. Data read from the first redundancy memory block RMB1 may be outputted to the input/output buffer circuit 140 through the first redundancy data line group RDLG1, the second redundancy data line group RDLG2 and the second data line group DLG2. Accordingly, the bad area in the second sub memory block SMB2 may be replaced with the specified area of the first redundancy memory block RMB1.

When the first redundancy memory block RMB1 replaces the bad area in the first sub memory block SMB1, the first switching circuit SW1 may be activated and the second and the third switching circuits SW2 and SW3 may not be activated.

In an embodiment of the present invention, the second redundancy memory block RMB2 may be used for replacing the bad area in the first sub memory block SMB1 as well as the bad area in the second sub memory block SMB2.

In an embodiment of the present invention, a specified area in the second redundancy memory block RMB2 may replace the bad area in the first sub memory block SMB1. For example, data to be programmed to the first sub memory block SMB1 may be transmitted from the input/output buffer circuit 140 through the first data line group DLG1. If the first and the second sub switching circuits SW1 and SW2 are activated and the third switching circuit SW3 is not activated, data corresponding to the bad area in the first sub memory block SMB1 may be provided to the second redundancy page buffer RPB2 through the first data line group DLG1, the first redundancy data line group RDLG1 and the second redundancy data line group RDLG2. A logic block such as a multiplexer (not shown) may be employed to select a data route. For example, the logic block may select a data route which is formed though the second redundancy page buffer RPB2 and the second redundancy data line group RDLG2 instead of a data route which is formed though the first redundancy page buffer RPB1 and the first redundancy data line group RDLG1 so that data are stored not in the first redundancy page buffer RPB1 but in the second redundancy page buffer RPB2. Data read from the second redundancy memory block RMB2 may be outputted to the input/output buffer circuit 140 through the second redundancy data line group RDLG2, the first redundancy data line group RDLG1 and the first data line group DLG1.

When the second redundancy memory block RMB2 replaces the bad area in the second sub memory block SMB2, the third switching circuit SW3 may be activated and the first and the second switching circuits SW1 and SW2 may not be activated.

The redundancy selector 151 turns on or off the first to third switching circuits SW1, SW2 and SW3 in response to the column address CA. This will be described in detail with reference to accompanying drawings FIG. 8 to FIG. 11.

If the first redundancy memory block RMB1 replaces only the bad area in the first sub memory block SMB1 and the second redundancy memory block RMB2 replaces only the bad area in the second sub memory block SMB2, the first and the second redundancy memory blocks RMB1 and RMB2 should include adequate memory cells to replace the bad areas in the first and the second sub memory blocks SMB1 and SMB2, respectively.

In an embodiment of the present invention, the first and the second redundancy memory block RMB1 and RMB2 may selectively replace the bad areas in the first and the second sub memory blocks SMB1 and SMB2. Therefore, the number of memory cells required in the first and the second redundancy memory blocks RMB1 and RMB2 may be reduced. Accordingly, the present invention may provide the semiconductor memory block having reduced area.

Figure 4:
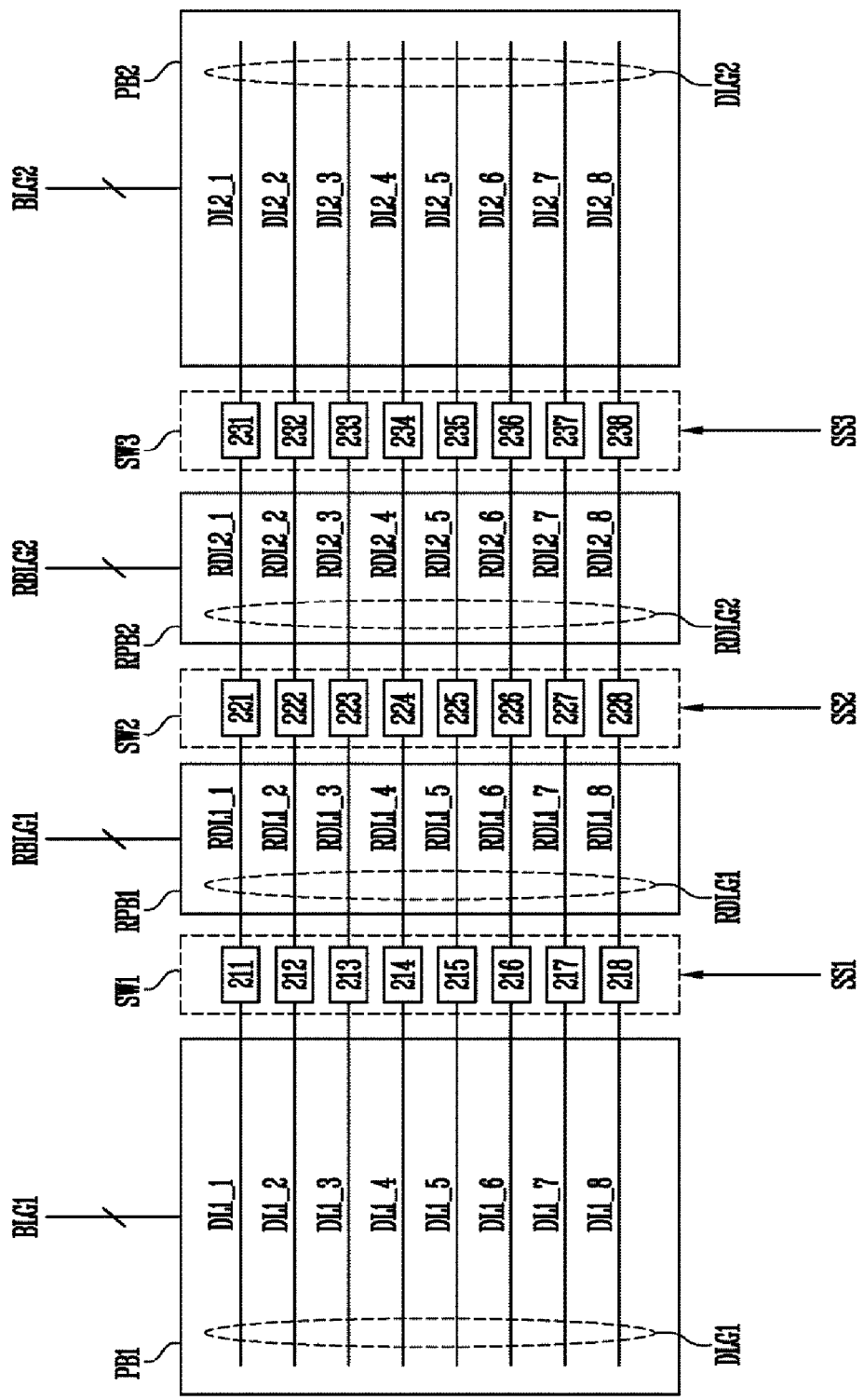
FIG. 4 is a block diagram illustrating a page buffer circuit, data line groups DLG1, RDLG1, RDLG2 and DLG2 and switching circuits SW1, SW2 and SW3 according to an embodiment of the present invention.

In FIG. 3 and FIG. 4, the first data line group DLG1 may include a first to eighth data lines DL1_1, . . . , DL1_8. The first redundancy data line group RDLG1 may include a first to eighth redundancy data lines RDL1_1, . . . , RDL1_8. The first switching circuit SW1 may include a first to eighth switches 211, . . . , 218, and coupled between the data lines DL1_1, . . . , DL1_8 of the first data line group DLG1 and the redundancy data lines RDL1_1, . . . , RDL1_8 of the first redundancy data line group RDLG1.

The second redundancy data line group RDLG2 may include a first to eighth redundancy data lines RDL2_1, . . . , RDL2_8. The second switching circuit SW2 may include a first to eighth switches 221, . . . , 228, and coupled between the redundancy data lines RDL1_1, . . . , RDL1_8 of the first redundancy data ling group RDLG1 and the redundancy data lines RDL2_1, . . . , RDL2_8 of the second redundancy data line group RDLG2.

The second data line group DLG2 may include a first to eighth data lines DL2_1, . . . , DL2_8. The third switching circuit SW3 may include a first to eighth switches 231, . . . , 238, and coupled between the redundancy data lines RDL2_1, . . . , RDL2_8 of the second redundancy data line group RDLG2 and the data lines DL2_1, . . . , DL2_8 of the second data line group DLG2.

The first to third switching circuits SW1, SW2 and SW3 may operate in response to a first to third switching signals SS1, SS2 and SS3 outputted from the first redundancy select unit 151, respectively. For example, switches in a corresponding switching circuit may turn on in the event that the switching signal is activated. In the event that the switching signal is not activated, switches in a corresponding switching circuit may turn off. In an embodiment of the present invention, each of the switches 211, . . . , 218, 221, . . . , 228 and 231, . . . , 238 may include at least one transistor (not shown). For example, each of the switches 211, . . . , 218, 221, . . . , 228 and 231, . . . , 238 may include an NMOS transistor and a PMOS transistor coupled in parallel.

Figure 5:
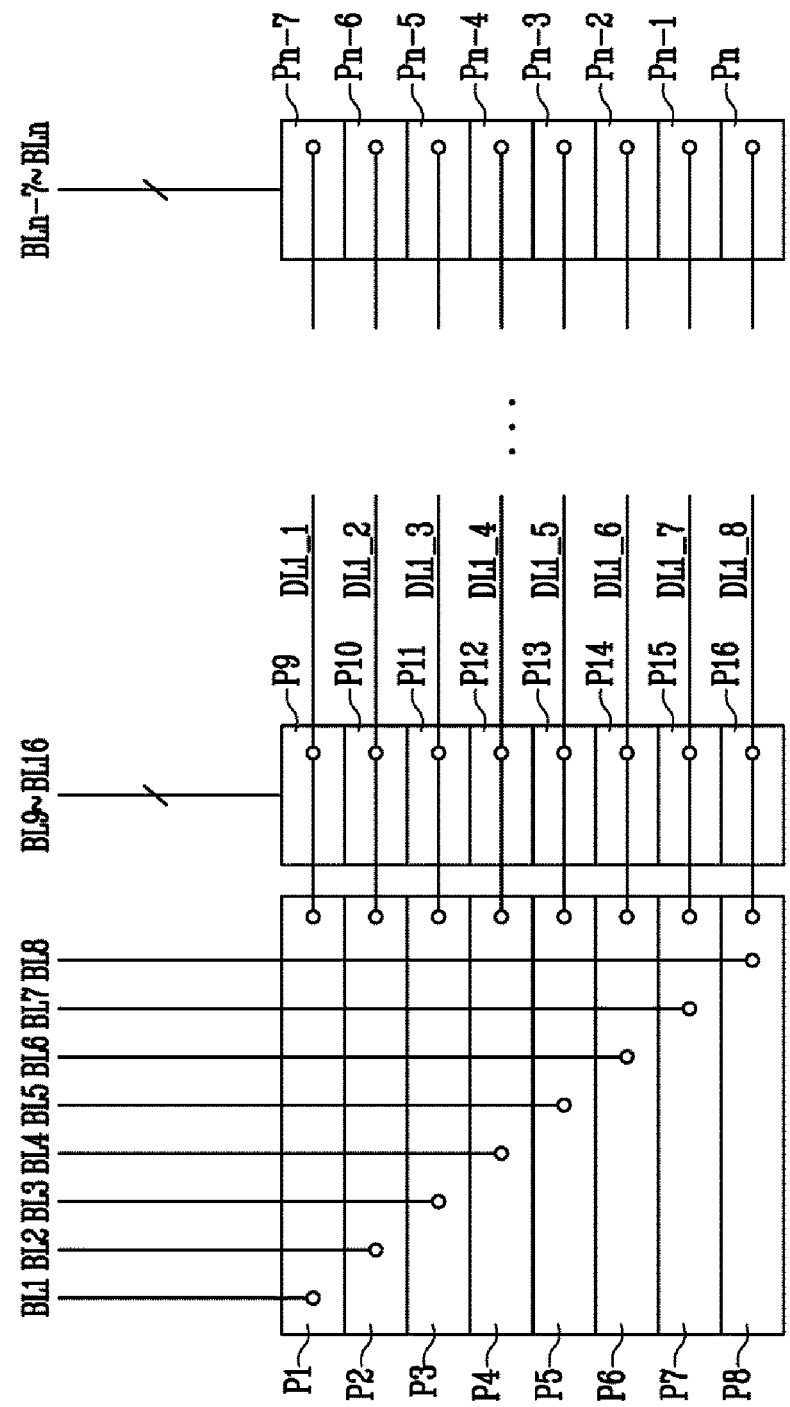
FIG. 5 is a block diagram illustrating one PB1 of the page buffers PB1, RPB1, RPB2 and PB2 in FIG. 4.

In FIG. 5, the first page buffer PB1 may include page buffer units P1, . . . , Pn. In an embodiment of the present invention, the page buffer units P1, . . . , Pn may be divided into groups, each of the groups including eight page buffer units. Page buffer units in one group are disposed in the direction of a bit line. Only the first page buffer PB1 is shown in FIG. 5, but the second page buffer PB2, the first redundancy page buffer RPB1 and the second redundancy page buffer RPB2 may have a similar configuration to the first page buffer PB1.

The first to eighth page buffer units may be coupled to a first to eighth bit lines, respectively. A ninth to nth page buffer units may be coupled to a ninth to nth bit lines BL9, . . . , BLn, respectively.

The first to nth page buffer units may be coupled to the first to the eight data lines DL1_1, . . . , DL1_8. In an embodiment of the present invention, the first page buffer unit, e.g. P1 may be coupled to the first data line DL1_1, the second page buffer unit, e.g. P2 may be coupled to the second data line DL1_2, the third page buffer unit, e.g. P3 may be coupled to the third data line DL1_3, and the fourth page buffer unit, e.g. P4 may be coupled to the fourth data line DL1_4. The fifth page buffer unit, e.g. P5 may be coupled to the fifth data line DL1_5, the sixth page buffer unit, e.g. P6 may be coupled to the sixth data line DL1_6, the seventh page buffer unit, e.g. P7 may be coupled to the seventh data line DL1_7, and the eighth page buffer unit, e.g. P8 may be coupled to the eighth data line DL1_8.

As a result, the first page buffer PB1 may be coupled between the first data line group DLG1 and a bit line group BLG1.

Figure 6:
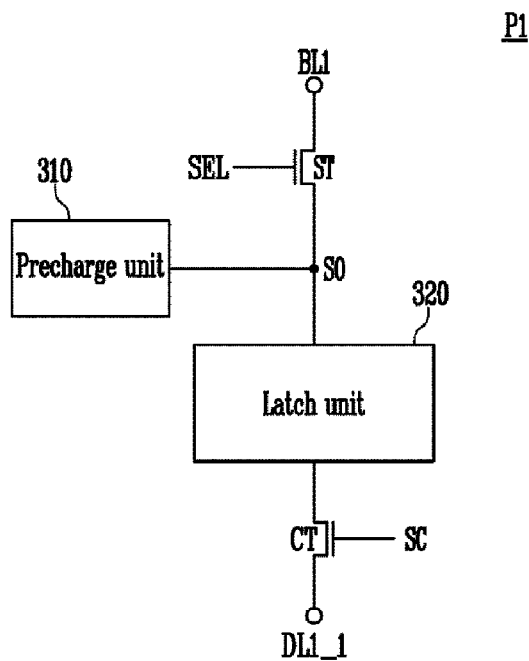
FIG. 6 is a view illustrating one P1 of the page buffer units P1, . . . , Pn in FIG. 5.

In FIG. 6, a page buffer unit P1 may include a sensing transistor ST, a precharge unit 310, a latch unit 320 and a control transistor CT. In the program operation or the read operation, the sensing transistor ST may be turned on or turned off in response to a select signal SEL, and may couple the bit line BL1 to a sensing node SO. The select signal SEL may be transmitted from the control logic (e.g., 150 in FIG. 1). The precharge unit 310 may precharge the sensing node SO by using, for example, a supply voltage. The latch unit 320 may store data to be programmed that may be transmitted through the data line DL1_1, or may store read data that may be transmitted through the bit line BL1 and the sensing node SO.

As described in FIG. 1, the page buffer circuit (e.g., 130 in FIG. 1) may decode the redundancy column address RCA outputted from the control logic 150. Referring to FIGS. 1 and 6, a column select signal SC is provided according to the decoded address RCA. A column select signal SC of a page buffer unit coupled to the bad area may not be enabled. A column select signal SC of a page buffer unit coupled to the specified area, e.g., specified area in RMB1 or RMB2 for replacing the bad area may be enabled. The control transistor CT may electrically connect the latch unit 320 to the data line DL1_1 in response to the enabled column select signal SC. Consequently, data transmitted through a corresponding data line may be delivered to each of the page buffer units, by controlling the column select signal SC of respective page buffer units.

Figure 7:
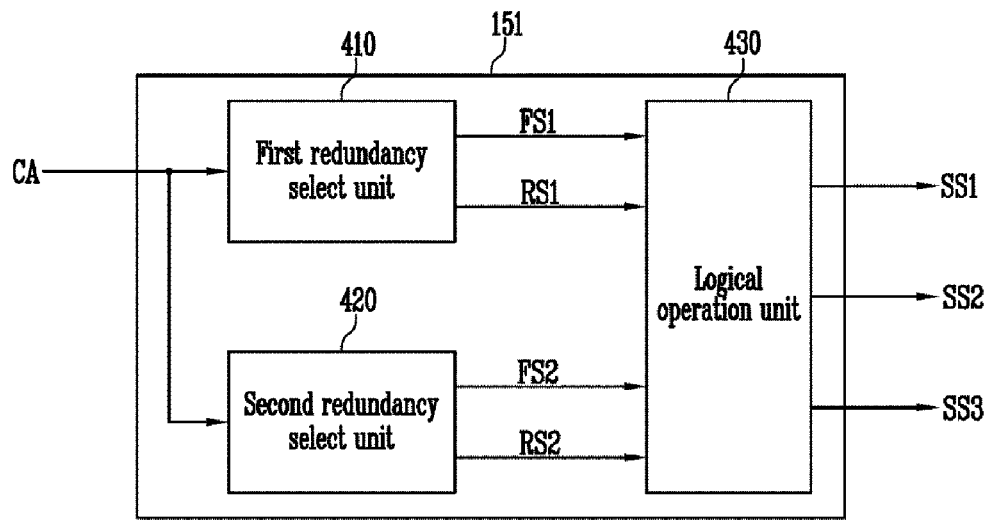
FIG. 7 is a block diagram illustrating the redundancy selector in FIG. 3 according to an embodiment of the present invention.

In FIG. 7, the redundancy selector 151 may include a first redundancy select unit 410, a second redundancy select unit 420 and a logical operation unit 430.

The first redundancy select unit 410 may correspond to the first sub memory block SMB1. The first redundancy select unit 410 may receive the column address CA and may select a redundancy memory block between the first and the second redundancy memory blocks RMB1 and RMB2 for replacing the bad area in the first sub memory block SMB1, on the basis of the column address CA.

The first redundancy select unit 410 may store fail addresses indicating the bad areas in the first sub memory block SMB1. The first redundancy select unit 410 may generate a first fail signal FS1 when a fail address identical to the column address CA exists in the stored fail addresses. The first redundancy select unit 410 may generate a first redundancy signal RS1 for selecting a redundancy memory block, according to the fail address identical to the column address CA.

The second redundancy select unit 420 may correspond to the second sub memory block SMB2. The second redundancy select unit 420 may select a redundancy memory block between the first and the second redundancy memory blocks RMB1 and RMB2 for replacing the bad area in the second sub memory block SMB2.

The second redundancy select unit 420 may store fail addresses indicating the bad areas in the second sub memory block SMB2, and may generate a second fail signal FS2 when a fail address identical to the column address CA exists in the stored fail addresses. The second redundancy select unit 420 may generate a second redundancy signal RS2 for selecting a redundancy memory block, according to the fail address identical to the column address CA.

The logical operation unit 430 may receive the first fail signal FS1 and the first redundancy signal RS1 from the first redundancy select unit 410, and may receive the second fail signal FS2 and the second redundancy signal RS2 from the second redundancy select unit 420. The logical operation unit 430 may output the first to third switching signals SS1, SS2 and SS3 by performing logical operations on the received fail signals FS1 and FS2 and the redundancy signals RS1 and RS2. The first to third switching circuits SW1, SW2 and SW3 may be controlled by the first to third switching signals SS1, SS2 and SS3, respectively.

Figure 8:
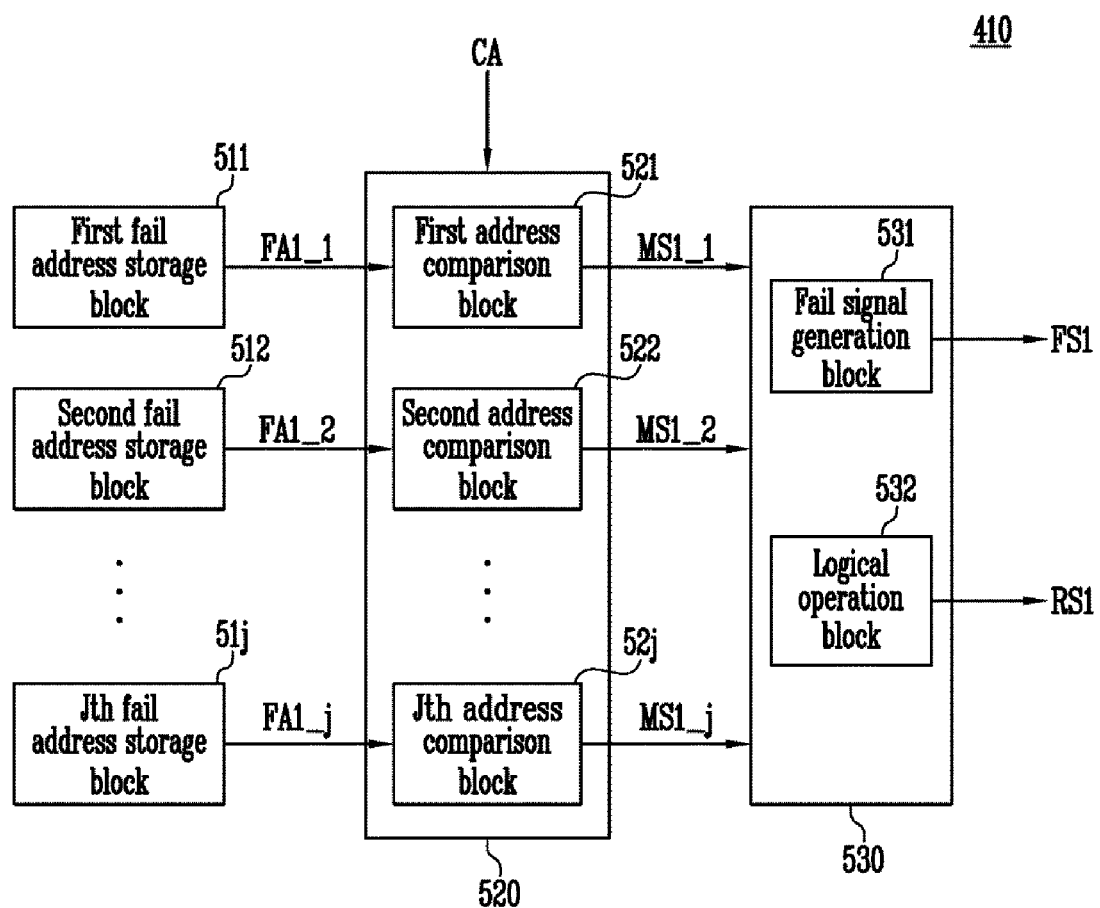
FIG. 8 is a block diagram illustrating the first redundancy select unit in FIG. 7 according to an embodiment of the present invention.

In FIG. 8, the first redundancy select unit 410 may include a first to jth fail address storage blocks 511, . . . , 51j, an address comparator 520 and a redundancy signal generator 530.

The first to jth fail address storage blocks 511, . . . , 51j may store a first to jth fail addresses FA1_1, . . . , FA1_j indicating the bad areas in the first sub memory block SMB1, respectively. The fail addresses may be column addresses indicating the bad areas in the first sub memory block SMB1. The bad area may include failed signal lines and failed memory cells, but not limited thereto.

In an embodiment of the present invention, each of the fail address storage blocks may include latches. The fail address stored in a given area of the memory cell array 110 may be loaded to a corresponding fail address storage block, when power of the semiconductor memory device is turned on.

The address comparator 520 may include a first to jth address comparison blocks 521, . . . , 52j. The first to jth address comparison blocks 521, . . . , 52j may receive the column address CA of the address (e.g., ADDR in FIG. 1). The first to jth address comparison blocks 521, . . . , 52j may receive the first to jth fail addresses FA1_1, . . . , FA1_j, respectively. Each of the first to jth address comparison blocks 521, . . . , 52j may determine whether the column address CA is substantially identical to a corresponding fail address of the first to jth fail addresses FA1_1, . . . , FA1_j. The first to jth address comparison blocks 521, . . . , 52j may output respectively a first to jth matching signals MS1_1, . . . , MS1_j, according to the determined. Each of the address comparison blocks may output an activated matching signal when the column address CA is substantially identical to corresponding fail address.

The redundancy signal generator 530 may include a fail signal generation block 531 and a logical operation block 532. The fail signal generation block 531 may activate the first fail signal FS1 in the event that the activated matching signal of the first to jth matching signals MS1_1, . . . , MS1_j exists. That is, the first fail signal FS1 is activated when a fail address identical to the column address CA exists in the first to jth fail addresses FA1_1, . . . , FA1_j.

The logical operation block 532 may generate the first redundancy signal RS1 by encoding the first to jth matching signals MS1_1, . . . , MS1_j. That is, the first redundancy signal RS1 may be determined according to the activated matching signal of the first to jth matching signals MS1_1, . . . , MS1_j. For example, the first redundancy signal RS1 may have a logic "1" when the column address CA corresponds to a specified bad area of the first sub memory block SMB1, and a logic "0" when the column address CA corresponds to another bad area of the first sub memory block SMB1.

Figure 9:
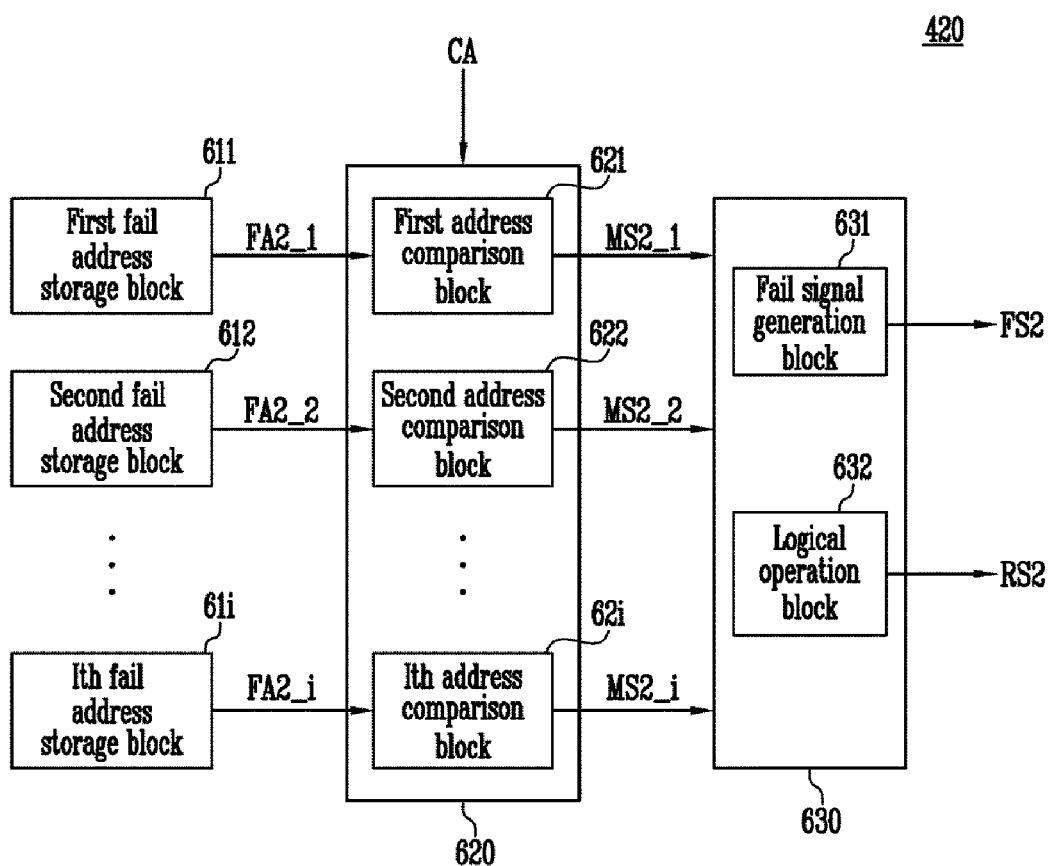
FIG. 9 is a block diagram illustrating the second redundancy select unit in FIG. 7 according to an embodiment of the present invention.

In FIG. 9, the second redundancy select unit 420 may have a similar configuration to the first redundancy select unit 410 in FIG. 8. The second redundancy select unit 420 may include a first to ith fail address storage blocks 611, . . . , 61i, an address comparator 620 and a redundancy signal generator 630.

The first to ith fail address storage blocks 611, . . . , 61i may store a first to an ith fail addresses FA2_1, . . . , FA2_i indicating the bad areas in the second sub memory block SMB2, respectively. The fail addresses may be column addresses indicating the bad areas in the second sub memory block SMB2. The bad area may include failed signal lines and failed memory cells, but not limited thereto.

The address comparator 620 may include a first to ith address comparison blocks 621, . . . , 62i. Each of the first to ith address comparison blocks 621, . . . , 62i may determine whether the column address CA is substantially identical to corresponding fail address of the first to ith fail addresses FA2_1, . . . , FA2_i, and may output a corresponding matching signal of a first to ith matching signals MS2_1, ..., MS2_i according to the determination of the first to ith address comparison blocks 621, ..., 62i.

The redundancy signal generator 630 may include a fail signal generation block 631 and a logical operation block 632. The fail signal generation block 631 may output the activated second fail signal FS2 in the event that an activated matching signal of the first to ith matching signals MS2_1, ..., MS2_i exists. The logical operation block 632 may generate the first redundancy signal RS1 by encoding the first to ith matching signals MS2_1, ..., MS2_i.

In FIG. 10, in a first case (i.e., case 1), the first and second fail signals FS1 and FS2 may not be activated (e.g., each of the first and the second fail signals FS1 and FS2 has a logic level "0"). In the event that the first fail signal FS1 is not activated, a redundancy memory block for replacing the first sub memory block SMB1 may not be required. In the event that the second fail signal FS2 is not activated, a redundancy memory block for replacing the second sub memory block SMB2 may not be required. The logical operation unit 430 may not activate the first to third switching circuits SW1, SW2 and SW3, irrespective of logic of the first and second redundancy signals RS1 and RS2.

In a second case (i.e., case 2), the first and the second fail signals FS1 and FS2 may be activated (e.g., each of the first and the second fail signals FS1 and FS2 has a logic level "1"). A redundancy memory block for replacing each of the first and the second sub memory blocks SMB1 and SMB2 may be required. The first redundancy signal RS1 has logic "1", and the second redundancy signal RS2 has logic "0".

In an embodiment of the present invention, the first redundancy memory block RMB1 may replace the bad area in a corresponding sub memory block when the redundancy signal has logic "1", and the second redundancy memory block RMB2 may replace the bad area in a corresponding sub memory block when the redundancy signal has logic "0".

The bad area in the first sub memory block SMB1 may be replaced with the first redundancy memory block RMB1 when the first redundancy signal RS has a logic level "1", and the bad area in the second sub memory block SMB2 may be replaced with the second redundancy memory block RMB2 when the second redundancy signal RS2 has a logic level "0". The first and third switching circuits SW1 and SW3 may be activated and the second switching circuit SW2 may not be activated, when the first redundancy signal RS has a logic level "1" and the second redundancy signal RS2 has a logic level "0". Accordingly, the first data line group DLG1 and the first redundancy data line group RDLG1 may be electrically connected, and the second data line group DLG2 and the second redundancy data line group RDLG2 may be electrically connected. As a result, the bad area in the first sub memory block SMB1 may be replaced with the first redundancy memory block RMB1, and the bad area in the second sub memory block SMB2 may be replaced with the second redundancy memory block RMB 2.

In a third case and a fourth case (i.e., case 3 and 4), the first and second fail signals FS1 and FS2 may have logic level "1" and logic level "0", respectively. The third switch circuit SW3 may not be activated when the second fail signal FS2 has a logic level "0", irrespective of the second redundancy signal RS2.

In the third case (i.e., case 3), the first redundancy signal RS1 has a logic level "1". The bad area in the first sub memory block SMB1 may be replaced with the first redundancy memory block RMB1. The redundancy selector 151 may activate the first switching circuit SW1 and may not activate the second switching circuit SW2.

In the fourth case (i.e., case 4), the first redundancy signal RS1 has a logic level "0". As a result, the bad area in the first sub memory block SMB1 may be replaced with the second redundancy memory block RMB2. The logical operation unit 430 may activate the first and second switching circuits SW1 and SW2 and may not activate the third switching circuit SW3, by controlling the first to third switching signals SS1, SS2 and SS3. The first data line group DLG1, the first redundancy data line group RDLG1 and the second redundancy data line group RDLG2 may be electrically connected to each other. Accordingly, the bad area in the first sub memory block SMB1 may be replaced with the second redundancy memory block RMB2.

In a fifth case and a sixth case (i.e., case 5 and 6), the first fail signal FS1 has a logic level "0". A redundancy memory block for replacing the first sub memory block SMB1 may not be required. The first switching circuit SW1 may not be activated when the first fail signal FS1 has a logic level "0". The second fail signal FS2 has a logic level "1". A redundancy memory block for replacing the second sub memory block SMB2 may be required. The second and the third switching circuits SW2 and SW3 may be controlled according to a logic value of the second redundancy signal RS2.

In the fifth case, the second redundancy signal RS2 has a logic level "1". As a result, the logical operation unit 430 may activate the second and third switching circuits SW2 and SW3. The bad area in the second sub memory block SMB2 may be replaced with the first redundancy memory block RMB1.

In the sixth case, the second redundancy signal RS2 has a logic level "0". As a result, the logical operation unit 430 may not activate the second switching circuit SW2 and may activate the third switching circuit SW3. The bad area in the second sub memory block SMB2 may be replaced with the second redundancy memory block RMB2.

In an embodiment of the present invention, the first and second redundancy memory blocks RMB1 and RMB2 may be shared by the first and second sub memory blocks SMB1 and SMB2. Accordingly, the present invention may provide the semiconductor memory device having reduced area.

Figure 11:
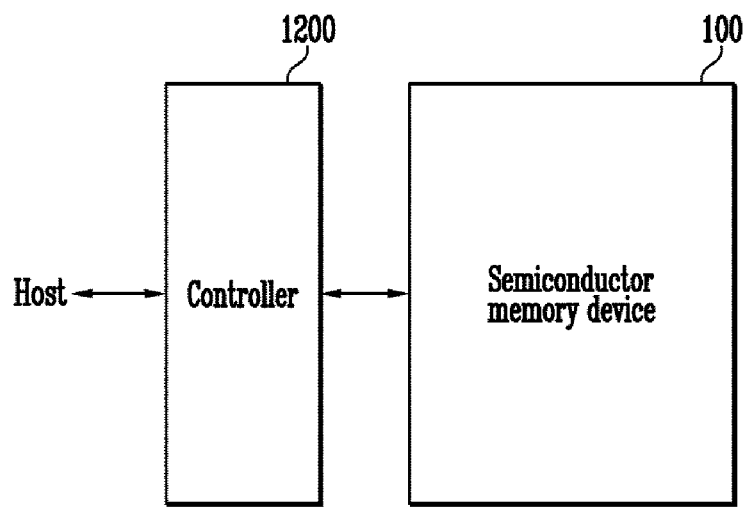
FIG. 11 is a block diagram illustrating a memory system including the semiconductor memory device in FIG. 1.

In FIG. 11, a memory system 1000 may include the semiconductor memory device 100 and a controller 1200.

The semiconductor memory device 100 may include elements and operate as shown in FIG. 1 to FIG. 10. Hereinafter, any further description concerning the same elements and operation will be omitted.

The controller 1200 may be coupled to a host and the semiconductor memory device 100. The controller 1200 may access the semiconductor memory device 100 in response to a request from the host. For example, the controller 1200 may control a read operation, a program operation, an erase operation and a background operation of the semiconductor memory device 100. The controller 1200 may provide an interface between the semiconductor memory device 100 and the host. The controller 1200 may drive a firmware for controlling the semiconductor memory device 100.

The controller 1200 may include elements such as a random access memory RAM, a processing unit, a host interface and a memory interface. The RAM may be used as one or more of an operation memory, a cache memory between the semiconductor memory device 100 and the host and a buffer memory between the semiconductor memory device 100 and the host. The processing unit may control operation of the controller 1200.

The host interface may include a protocol for a data exchange between the host and the controller 1200. In an embodiment of the present invention, the controller 1200 may communicate with the host through at least one of various interface protocols such as a universal serial bus USB protocol, a multimedia card MMC protocol, a peripheral component interconnection PCI protocol, a PCI-express PCI-E protocol, an advanced technology attachment ATA protocol, a serial-ATA protocol, a parallel-ATA protocol, a small computer small interface SCSI protocol, an enhanced small disk interface ESDI protocol, an integrated drive electronics IDE protocol, a private protocol, etc.

The memory interface may interface with the semiconductor memory device 100. For example, the memory interface may include a NAND interface or a NOR interface.

The memory system 1000 may further include an error correction block. The error correction block may detect and correct error in a data read from the semiconductor memory device 100 using an error correction code ECC. In an embodiment of the present invention, the error correction block may be provided as an element of the controller 1200.

Even though a failed memory cell exists after the program operation of the semiconductor memory device 100 is performed, the program operation may be finished if the number of the programmed failed memory cells is less than a predetermined number. In other words, data stored in the semiconductor memory device 100 may include error. The error correction block may detect and correct the error in the read operation.

The controller 1200 and the semiconductor memory device 100 may be integrated in one semiconductor device. In an embodiment of the present invention, the controller 1200 and the semiconductor memory device 100 may be integrated in one semiconductor device to form a memory card. For example, the controller 1200 and the semiconductor memory device 100 may be integrated in one semiconductor device to form a memory card such as a personal computer memory card international association PCMCIA, a compact flash card CF, a smart media card SM or SMC, a memory stick, a multimedia card MMC, RS-MMS, MMCmicro, an SD card SD, miniSD, micro SD, SDHC, a universal flash memory device UFS, etc.

The controller 1200 and the semiconductor memory device 100 may be integrated in one semiconductor device to form a solid state drive SSD. The semiconductor drive SSD may include a storage device for storing data in a semiconductor memory. In the event that the memory system 1000 is used as the semiconductor drive SSD, operation speed of the host coupled to the memory system 1000 may be improved.

In an embodiment of the present invention, the memory system 1000 may be provided as one of various elements of an electronic equipment such as a computer, an ultra mobile PC UMPC, a workstation, a net-book, a personal digital assistant PDA, a portable computer, a web tablet, a wireless phone, a mobile phone, a smart phone, an e-book, a portable multimedia player PMP, a digital camera, a three-dimensional television, a digital audio recorder, a digital audio player, a digital picture recorder, a digital picture player, a digital video recorder, a digital video player, an apparatus for enabling to transmit/receive information in a wireless environment, one of various electronic equipments included in a home network, one of various electronic equipments included in a computer network, one of various electronic equipments included in a telematics network, an RFID device or one of elements included in a computing system, etc.

In an embodiment of the present invention, the semiconductor memory device 100 or the memory system 1000 may be variously packaged. For example, the semiconductor memory device 100 or the memory system 1000 may be packaged through methods such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 12:
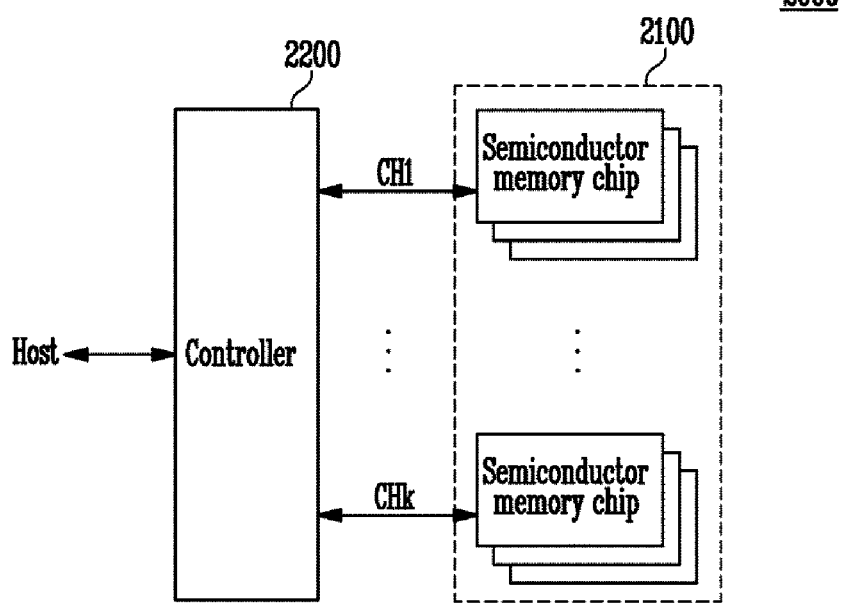
FIG. 12 is a block diagram illustrating application of a memory system in FIG. 11.

In FIG. 12, the memory system 2000 may include a semiconductor memory device 2100 and a controller 2200. The semiconductor memory device 2100 may include semiconductor memory chips. Each of the semiconductor memory chips may be divided into a plurality of groups. Each of the groups may communicate with the controller 2200 through a common channel. In FIG. 12, the groups may communicate with the controller 2200 through a first to kth channels CH1, . . . , CHk, respectively. Each of the semiconductor memory chips may operate similar to one of the semiconductor memory device 100 described in FIG. 1.

In FIG. 12, semiconductor memory chips may be coupled to one channel. However, one semiconductor memory chip may be coupled to one channel.

Figure 13:
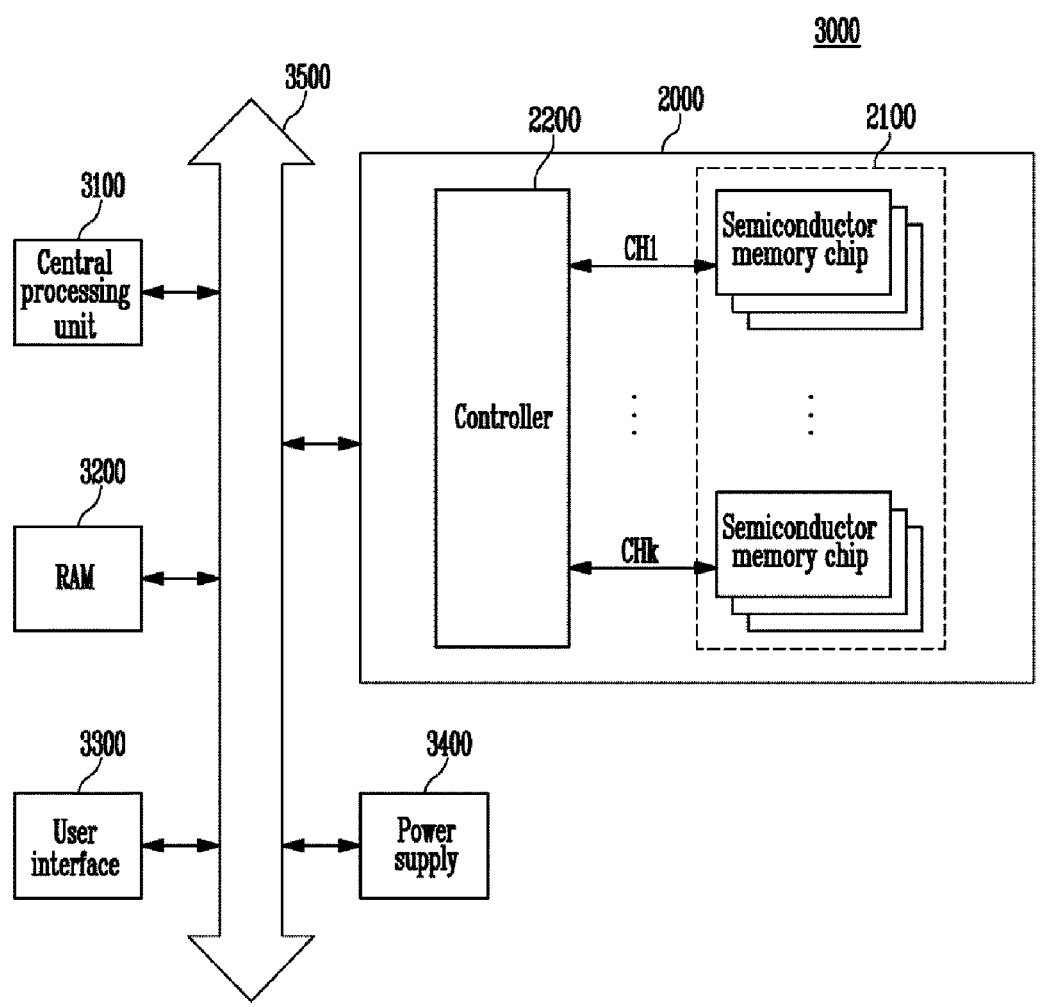
FIG. 13 is a block diagram illustrating a computing system including the memory system in FIG. 12.

In FIG. 13, a computing system 3000 may include a central processing unit 3100, a RAM 3200, a user interface 3300, a power supply 3400, a system bus 3500 and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 13, the semiconductor memory device 2100 may be coupled to the system bus 3500 through the controller 2200. However, the semiconductor memory device 2100 may be directly connected to the system bus 3500. Here, function of the controller 2200 may be performed by the central processing unit 3100 and the RAM 3200.

In FIG. 13, the memory system 2000 described in FIG. 12 is provided. However, the memory system 2000 may be replaced with the memory system 1000 in FIG. 11. In an embodiment of the present invention, the computing system 3000 may include each memory system 1000 and 2000 described in FIG. 11 and FIG. 12.

In an embodiment of the present invention, the redundancy memory block may be shared by the sub memory blocks. Accordingly, the area of the semiconductor memory device may decrease.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
 a first sub memory block and a second sub memory block;
 a first redundancy memory block and a second redundancy memory block;
 a first data line group and a second data line group coupled to the first sub memory block and the second sub memory block, respectively;

a first redundancy data line group and a second redundancy data line group coupled to the first redundancy memory block and the second redundancy memory block, respectively;
a first switching circuit coupled between the first data line group and the first redundancy data line group;
a second switching circuit coupled between the first redundancy data line group and the second redundancy data line group;
a third switching circuit coupled between the second redundancy data line group and the second data line group;
a first page buffer coupling the first sub memory block to the first data line group;
a second page buffer coupling the second sub memory block to the second data line group;
a first redundancy page buffer coupling the first redundancy memory block to the first redundancy data line group; and
a second redundancy page buffer coupling the second redundancy memory block to the second redundancy data line group,
wherein data to be programmed into the first redundancy memory block is transmitted to the first redundancy page buffer through the second data line group, when the second switch circuit and the third switching circuit are turned on.

2. The semiconductor memory device of claim 1, further comprising:
a redundancy selector including a first redundancy select unit and a second redundancy select unit,
wherein the first redundancy select unit is configured to select one of the first and the second redundancy memory blocks for replacing a bad area in the first sub memory block, and
the second redundancy select unit is configured to select one of the first and the second redundancy memory blocks for replacing a bad area in the second sub memory block.

3. The semiconductor memory device of claim 2, wherein each of the first redundancy select unit and the second redundancy select unit includes:
a plurality of fail address storage blocks configured to store fail addresses; and
a plurality of address comparison blocks configured to receive the fail addresses, respectively,
wherein each of the address comparison blocks outputs a matching signal according to whether a column address provided from an external device is substantially identical to corresponding fail address.

4. The semiconductor memory device of claim 3, wherein each of the first and the second redundancy select units further includes a redundancy signal generator receiving the matching signals provided from the address comparison blocks,
wherein the redundancy signal generator includes:
a fail signal generation block configured to output a fail signal enabled when one or more of the matching signals is enabled; and
a logical operation block configured to encode the matching signals to generate a redundancy signal.

5. The semiconductor memory device of claim 4, wherein the redundancy selector includes a logical operation unit configured to generate a first to a third switching signals to control the first to the third switching circuits, by performing logical operations on the fail signals and the redundancy signals provided from the first and the second redundancy select units.

6. A semiconductor memory device comprising:
a first sub memory block and a second sub memory block;
a first redundancy memory block and a second redundancy memory block;
a first data line group and a second data line group coupled to the first sub memory block and the second sub memory block, respectively;
a first redundancy data line group and a second redundancy data line group coupled to the first redundancy memory block and the second redundancy memory block, respectively;
a first switching circuit coupled between the first data line group and the first redundancy data line group;
a second switching circuit coupled between the first redundancy data line group and the second redundancy data line group;
a third switching circuit coupled between the second redundancy data line group and the second data line group;
a first page buffer coupling the first sub memory block to the first data line group;
a second page buffer coupling the second sub memory block to the second data line group;
a first redundancy page buffer coupling the first redundancy memory block to the first redundancy data line group; and
a second redundancy page buffer coupling the second redundancy memory block to the second redundancy data line group,
wherein data read from the first redundancy memory block to the first redundancy page buffer is outputted through the second data line group, when the second switching circuit and the third switching circuit are turned on.

7. The semiconductor memory device of claim 6, wherein data to be programmed to the second redundancy memory block is transmitted to the second redundancy page buffer through the first data line group, when the first switching circuit and the second switching circuit are turned on.

8. The semiconductor memory device of claim 6, wherein data read from the second redundancy memory block to the second redundancy page buffer is outputted through the first data line group, when the first switching circuit and the second switching circuit are turned on.

9. A semiconductor memory device comprising:
a first sub memory block and a second sub memory block;
a first redundancy memory block and a second redundancy memory block;
a first data line group and a second data line group coupled to the first sub memory block and the second sub memory block, respectively;
a first redundancy data line group and a second redundancy data line group coupled to the first redundancy memory block and the second redundancy memory block, respectively;
a first switching circuit coupled between the first data line group and the first redundancy data line group;
a second switching circuit coupled between the first redundancy data line group and the second redundancy data line group;
a third switching circuit coupled between the second redundancy data line group and the second data line group; and
a input/output buffer circuit configured to communicate data with the first data line group and the second data line group,
wherein data to be programmed into the first redundancy memory block is transmitted from the input/output buffer circuit via the second data line group and the second redundancy data line group to the first redundancy data line group.

10. The semiconductor memory device of claim 9, wherein data to be programmed into the second redundancy memory block is transmitted from the input/output buffer circuit via the first data line group and the first redundancy data line group to the second redundancy data line group when the first and second switching circuits are turned on and the third switching circuit is turned off.

11. A semiconductor memory device comprising:
a first sub memory block and a second sub memory block;
a first redundancy memory block and a second redundancy memory block;
a first data line group and a second data line group coupled to the first sub memory block and the second sub memory block, respectively;
a first redundancy data line group and a second redundancy data line group coupled to the first redundancy memory block and the second redundancy memory block, respectively;
a first switching circuit coupled between the first data line group and the first redundancy data line group;
a second switching circuit coupled between the first redundancy data line group and the second redundancy data line group;
a third switching circuit coupled between the second redundancy data line group and the second data line group; and
a input/output buffer circuit configured to communicate data with the first data line group and the second data line group,
wherein data read from the first redundancy memory block is transmitted via the first redundancy data line group, the second redundancy data line group and the second data line group to the input/output buffer circuit.

12. The semiconductor memory device of claim 11, wherein data read from the second redundancy memory block is transmitted via the second redundancy data line group, the first redundancy data line group and the first data line group to the input/output buffer circuit when the first and second switching circuits are turned on and the third switching circuit is turned off.

* * * * *